United States Patent
Takeshima et al.

(10) Patent No.: US 11,189,483 B2
(45) Date of Patent: Nov. 30, 2021

(54) METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Yuichiro Takeshima, Toyama (JP); Masanori Nakayama, Toyama (JP); Katsunori Funaki, Toyama (JP); Yasutoshi Tsubota, Toyama (JP); Hiroto Igawa, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/522,295

(22) Filed: Jul. 25, 2019

(65) Prior Publication Data

US 2019/0348282 A1 Nov. 14, 2019

Related U.S. Application Data

(63) Continuation of application No. PCT/JP2017/013632, filed on Mar. 31, 2017.

(51) Int. Cl.
*H05H 1/46* (2006.01)
*H01L 21/67* (2006.01)
(Continued)

(52) U.S. Cl.
CPC .. *H01L 21/02236* (2013.01); *H01L 21/02164* (2013.01); *H01L 21/311* (2013.01);
(Continued)

(58) Field of Classification Search
None
See application file for complete search history.

(56) References Cited

U.S. PATENT DOCUMENTS

2001/0051411 A1 12/2001 Ito et al.
2002/0173150 A1 11/2002 Kawai et al.
(Continued)

FOREIGN PATENT DOCUMENTS

JP 08-250482 A 9/1996
JP 9-172064 A 6/1997
(Continued)

OTHER PUBLICATIONS

Office Action in corresponding Korean Application No. 10-2019-7021740, dated Oct. 30, 2020, with English translation.

*Primary Examiner* — Stephanie P Duclair
(74) *Attorney, Agent, or Firm* — Edell, Shapiro & Finnan, LLC (57) ABSTRACT

According to one aspect of the technique of the present disclosure, there is provided a method of manufacturing a semiconductor device including: (a) providing a semiconductor processing apparatus including a substrate process chamber, a coil and a substrate support; (b) placing a target substrate with a concave structure of a silicon film on a substrate support, wherein a deteriorated layer is formed on an inner surface of the concave structure by deterioration of a surface layer of the silicon film due to an etching process; (c) supplying an oxygen-containing gas into the substrate process chamber; (d) applying a high frequency power to the coil to generate plasma of the oxygen-containing gas; and (e) oxidizing, by the plasma, a surface of the silicon film exposed in the concave structure wherein the deteriorated layer is formed on the surface.

8 Claims, 6 Drawing Sheets

(51) Int. Cl.
 *H01L 21/324* (2006.01)
 *H01L 21/3213* (2006.01)
 *H01L 21/321* (2006.01)
 *H01L 21/311* (2006.01)
 *H01L 21/3065* (2006.01)
 *H01L 21/02* (2006.01)
 *H01J 37/32* (2006.01)

(52) U.S. Cl.
 CPC .. *H01L 21/31105* (2013.01); *H01L 21/31116* (2013.01); *H01L 21/32105* (2013.01); *H01L 21/32137* (2013.01); *H01L 21/32138* (2013.01)

(56) References Cited

U.S. PATENT DOCUMENTS

| | | | |
|---|---|---|---|
| 2011/0177695 A1 | 7/2011 | Shimizu | |
| 2014/0106572 A1 | 4/2014 | Terasaki et al. | |
| 2014/0106573 A1 | 4/2014 | Terasaki et al. | |
| 2016/0163556 A1* | 6/2016 | Briggs | H01J 37/32623 438/696 |

FOREIGN PATENT DOCUMENTS

| | | |
|---|---|---|
| JP | 2005-217202 A | 8/2005 |
| JP | 2007-317874 A | 12/2007 |
| JP | 2008-182194 A | 8/2008 |
| JP | 2014-075579 A | 4/2014 |
| JP | 2016-105457 A | 6/2016 |
| KR | 10-0449134 B1 | 9/2004 |
| KR | 10-2011-0085909 A | 7/2011 |
| KR | 10-2014-0034705 A | 3/2014 |

\* cited by examiner

METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application is a continuation of International Application No. PCT/JP2017/013632, filed Mar. 31, 2017, the entire contents of which are hereby incorporated by reference.

TECHNICAL FIELD

The present disclosure relates to a method of manufacturing a semiconductor device and a non-transitory computer-readable recording medium.

BACKGROUND

When forming a circuit pattern of a semiconductor device such as a flash memory, a concave structure such as a trench structure formed on a surface of a substrate may be processed by performing an etching process on the concave structure, which is one of manufacturing processes of the semiconductor device. When the concave structure is processed, according to related arts, a process of forming a sacrificial oxide film by oxidizing a surface layer damaged by the etching process (also referred to as a "damaged layer") and removing the damaged layer by removing the sacrificial oxide film may be additionally performed.

According to the etching process described above, the damaged layer is generated on an inner surface of the concave structure. Therefore, in order to remove the damaged layer, a surface layer of the inner surface of the concave structure is oxidized to form the sacrificial oxide film. However, particularly when oxidizing the inner surface of the concave structure with a high aspect ratio by, for example, using techniques such as a thermal oxidation, a desired thickness uniformity (also referred to as a "step coverage") of the sacrificial oxide film on the inner surface of the concave structure may not be obtained due to a microloading effect on the thickness of the sacrificial oxide film or a dependency of underlying layer conditions such as a plane orientation dependency.

SUMMARY

Described herein is a technique capable of forming a sacrificial oxide film with good thickness uniformity on an inner surface of a concave structure formed on a surface of a substrate in a manufacturing process of a semiconductor device.

According to one aspect of the technique of the present disclosure, there is provided a substrate processing apparatus including: (a) providing a semiconductor processing apparatus including: a substrate process chamber including a plasma generation space where an oxygen-containing gas supplied thereto is plasma-excited and a substrate processing space in communication with the plasma generation space and capable of accommodating a substrate therein during a substrate processing; a coil provided at an outer peripheral portion of the plasma generation space wherein an electrical length of the coil is set to an integral multiple of a wavelength of a high frequency power applied thereto; and a substrate support capable of supporting the substrate below a lower end of the coil; (b) placing a target substrate with a concave structure of a silicon film formed thereon on the substrate support, wherein a deteriorated layer is formed on an inner surface of the concave structure by deterioration of a surface layer of the silicon film due to an etching process on the concave structure; (c) supplying the oxygen-containing gas into the substrate process chamber; (d) applying a high frequency power to the coil to generate plasma of the oxygen-containing gas in the plasma generation space; and (e) oxidizing, by the plasma, a surface of the silicon film exposed in the concave structure wherein the deteriorated layer is formed on the surface.

DETAILED DESCRIPTION

Embodiments

Hereinafter, one or more embodiments (hereinafter, simply referred to as "embodiments") according to the technique of the present disclosure will be described.

(1) Configuration of Substrate Processing Apparatus

Figure 1:
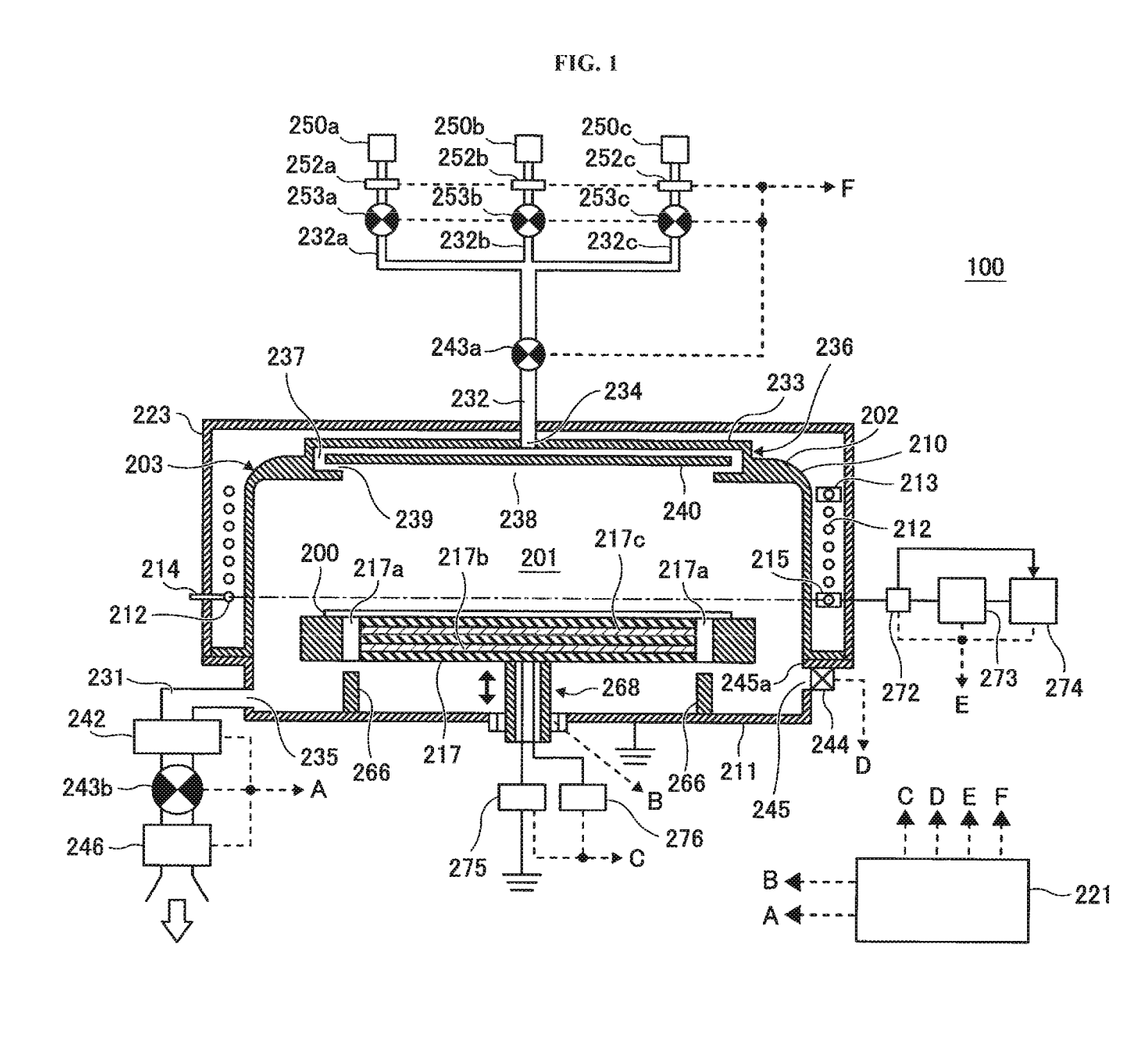
FIG. 1 schematically illustrates a vertical cross-section of a substrate processing apparatus according to one or more embodiments described herein.
Figure 2:
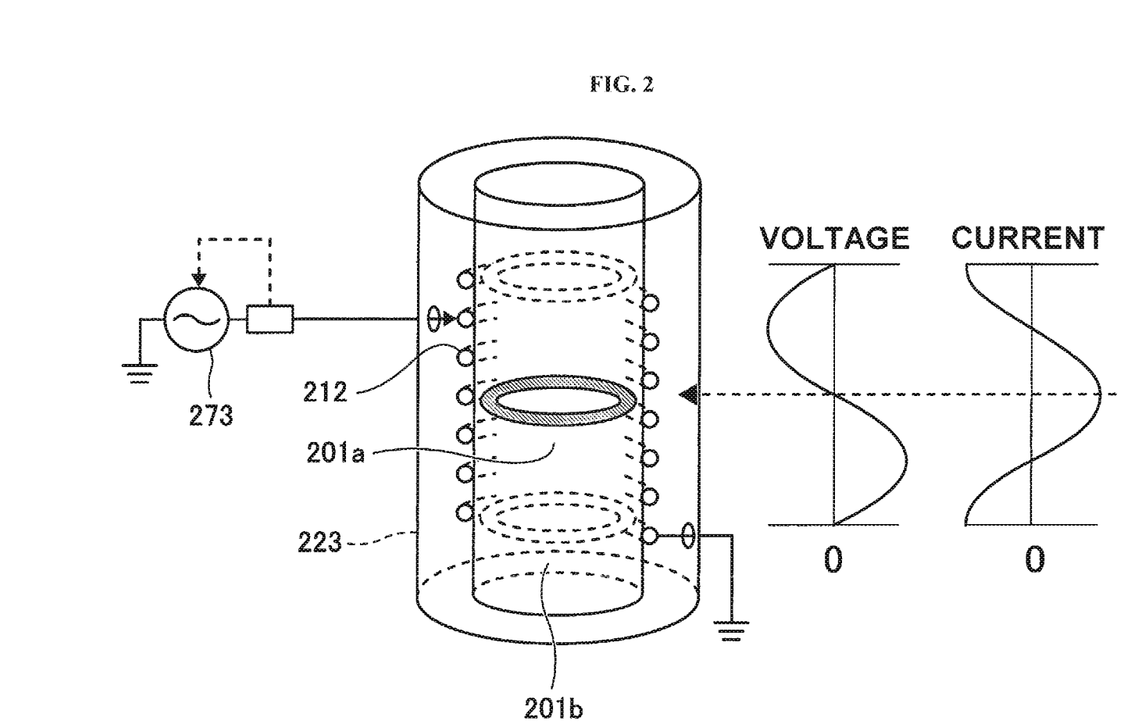
FIG. 2 schematically illustrates a principle of generating plasma in the substrate processing apparatus according to the embodiments.

Hereinafter, a substrate processing apparatus according to the embodiments will be described with reference to FIGS. 1 through 3.

Process Chamber

A substrate processing apparatus 100 includes a process furnace 202 where a wafer 200 is processed by plasma. The process furnace 202 includes a process vessel 203. A process chamber (also referred to as a "substrate process chamber") 201 is defined by the process vessel 203. The process vessel 203 includes a dome-shaped upper vessel 210 serving as a first vessel and a bowl-shaped lower vessel 211 serving as a second vessel. By covering the lower vessel 211 with the upper vessel 210, the process chamber 201 is defined.

A gate valve 244 is provided on a lower side wall of the lower vessel 211. While the gate valve 244 is open, the wafer 200 can be transferred (loaded) into the process chamber 201 through a substrate loading/unloading port 245 or be transferred (unloaded) out of the process chamber 201 through the substrate loading/unloading port 245. While the gate valve 244 is closed, the gate valve 244 maintains the process chamber 201 airtight.

The process chamber 201 includes a plasma generation space 201a that a coil (also referred to as a "resonance coil") 212 described later is provided therearound and a substrate processing space 201b where the wafer 200 is processed. The substrate processing space 201b communicates with the plasma generation space 201a. The plasma generation space 201a refers to a space where the plasma is generated, for example, a space above a lower end of the coil 212 (indicated by a dashed line in FIG. 1) in the process chamber 201. The substrate processing space 201b refers to a space where the wafer 200 is processed by the plasma, for example, a space below the lower end of the coil 212.

Susceptor

A susceptor 217 serving as a part of a substrate support is provided at a center of a bottom portion of the process chamber 201. The wafer 200 can be placed on the susceptor 217. That is, the susceptor 217 is configured to dispose the wafer 200 below the lower end of the coil 212. A heater 217b serving as a heating mechanism is integrally embedded in the susceptor 217. When electric power is supplied through a heater power adjustment mechanism 276, the heater 217b is configured to heat the wafer 200 such that a surface temperature of the wafer 200 may range, for example, from the room temperature to about 700° C.

The susceptor 217 is electrically insulated from the lower vessel 211. An impedance adjustment electrode 217c is provided in the susceptor 217. The impedance adjustment electrode 217c is grounded via an impedance variable mechanism 275 serving as an impedance adjustment mechanism. The impedance variable mechanism 275 is constituted by components such as a coil (not shown) and a variable capacitor (not shown). The impedance variable mechanism 275 is configured to change an impedance thereof from about 0 Ω to a parasitic impedance value of the process chamber 201 by controlling the inductance and resistance of the coil (not shown) and the capacitance value of the variable capacitor (not shown). Therefore, it is possible to control the potential (bias voltage) of the wafer 200 via the impedance adjustment electrode 217c and the susceptor 217.

A susceptor elevating mechanism 268 configured to elevate and lower the susceptor 217 is provided at the susceptor 217. Through-holes 217a are provided at the susceptor 217. Wafer lift pins 266 are provided at a bottom of the lower vessel 211 corresponding to the through-holes 217a. At least three of the through-holes 217a and at least three of the wafer lift pins 266 are provided at positions facing each other. When the susceptor 217 is lowered by the susceptor elevating mechanism 268, the wafer lift pins 266 pass through the through-holes 217a.

The substrate support according to the embodiments is mainly constituted by the susceptor 217, the heater 217b, and the impedance adjustment electrode 217c.

Gas Supply System

A gas supply head 236 is provided above the process chamber 201, that is, on an upper portion of the upper vessel 210. The gas supply head 236 includes a cap-shaped lid 233, a gas inlet port 234, a buffer chamber 237, an opening portion 238, a shield plate 240 and a gas outlet port 239. The gas supply head 236 is configured to supply a reactive gas (process gas) into the process chamber 201. The buffer chamber 237 functions as a dispersion space configured to disperse the reactive gas introduced (supplied) through the gas inlet port 234.

A downstream end of a gas supply pipe 232a configured to supply an oxygen (O2) gas serving as an oxygen-containing gas, a downstream end of a gas supply pipe 232b configured to supply a hydrogen (H2) gas serving as a hydrogen-containing gas, a downstream end of a gas supply pipe 232c configured to supply an argon (Ar) gas serving as an inert gas is connected to join the gas inlet port 234. An oxygen gas supply source 250a, a mass flow controller (MFC) 252a serving as a flow rate controller and a valve 253a serving as an opening/closing valve are provided in order from an upstream side to a downstream side of the gas supply pipe 232a. A hydrogen gas supply source 250b, an MFC 252b serving as a flow rate controller and a valve 253b serving as an opening/closing valve are provided in order from an upstream side to a downstream side of the gas supply pipe 232b. A argon gas supply source 250c, an MFC 252c serving as a flow rate controller and a valve 253c serving as an opening/closing valve are provided in order from an upstream side to a downstream side of the gas supply pipe 232c. A valve 243a is provided on a downstream side where the gas supply pipe 232a, the gas supply pipe 232b and the gas supply pipe 232c join. The valve 243a is connected to an upstream end of the gas inlet port 234. It is possible to supply the process gas such as the oxygen-containing gas, the hydrogen-containing gas and the inert gas (argon gas) into the process chamber 201 via the gas supply pipes 232a, 232b and 232c by opening and closing the valves 253a, 253b, 253c and 243a while adjusting the flow rates of the respective gases by the MFCs 252a, 252b and 252c.

An oxygen-containing gas supply system according to the embodiments is constituted by the gas supply head 236 (that is, the lid 233, the gas inlet port 234, the buffer chamber 237, the opening portion 238, the shield plate 240 and the gas outlet port 239), the gas supply pipe 232a, the MFC 252a and the valves 253a and 243a.

A hydrogen-containing gas supply system according to the embodiments is constituted by the gas supply head 236, the gas supply pipe 232b, the MFC 252b and the valves 253b and 243a.

An inert gas supply system according to the embodiments is constituted by the gas supply head 236, the gas supply pipe 232c, the MFC 252c and the valves 253c and 243a.

A gas supply system according to the embodiments is constituted by the oxygen-containing gas supply system, the hydrogen-containing gas supply system and the inert gas supply system.

The oxygen-containing gas supply system may further include the oxygen gas supply source 250a, the hydrogen-containing gas supply system may further include the hydrogen gas supply source 250b, and the inert gas supply system may further include the argon gas supply source (inert gas supply source) 250c. The gas supply system may further include the oxygen gas supply source 250a, hydrogen gas supply source 250b and the argon gas supply source (inert gas supply source) 250c.

Exhaust System

A gas exhaust port 235 is provided on a side wall of the lower vessel 211. The gas such as the reactive gas is exhausted from the process chamber 201 through the gas exhaust port 235. An upstream end of a gas exhaust pipe 231 is connected to the gas exhaust port 235. An APC (Automatic Pressure Controller) valve 242 serving as a pressure controller (pressure adjusting mechanism), a valve 243b serving as an opening/closing valve and a vacuum pump 246 serving as a vacuum exhaust device are provided in order from an upstream side to a downstream side of the gas exhaust pipe 231.

An exhaust system according to the embodiments is mainly constituted by the gas exhaust port 235, the gas exhaust pipe 231, the APC valve 242 and the valve 243b. The exhaust system may further include the vacuum pump 246.

Plasma Generator

A helical resonance coil 212 is provided so as to surround the process chamber 201 around an outer peripheral portion of the process chamber 201, that is, around an outer portion of a side wall of the upper vessel 210. An RF sensor 272, a high frequency power supply 273 and a frequency matching mechanism 274 are connected to the resonance coil 212.

The high frequency power supply 273 supplies a high frequency power to the resonance coil 212. The RF sensor 272 is provided at an output side of the high frequency power supply 273. The RF sensor 272 monitors information of the traveling wave or reflected wave of the high frequency power supplied to the resonance coil 212. The frequency matching mechanism 274 serving as a frequency controller performs a frequency matching operation by controlling the high frequency power supply 273 so as to minimize the reflected wave based on the information of the reflected wave monitored by the RF sensor 272.

Both ends of the resonance coil 212 are electrically grounded. However, at least one end of the resonance coil 212 may be grounded via a movable tap 213 in order to fine-tune an electrical length of the resonance coil 212 when the substrate processing apparatus 100 is initially installed or the processing conditions of the substrate processing apparatus 100 are changed in order for the resonance characteristics of the resonance coil 212 to become approximately same as those of the high frequency power supply 273. A reference numeral 214 in FIG. 1 indicates a fixed ground of the other end of the resonance coil 212. In addition, in order to fine-tune the impedance of the resonance coil 212 when the substrate processing apparatus 100 is initially installed or the processing conditions of the substrate processing apparatus 100 are changed, a power feeding part (not shown) is constituted by the movable tap 215 between the grounded ends of the resonance coil 212.

A shield plate 223 is provided to shield the leakage of the electromagnetic wave to the outside of the resonance coil 212 and to form a capacitive component of the resonance coil 212 necessary for constructing a resonance circuit. The shield plate 223 is disposed, for example, about 5 mm to 150 mm apart from an outer periphery of the resonance coil 212.

The plasma generator according to the embodiments is mainly constituted by the resonance coil 212, the RF sensor 272 and the frequency matching mechanism 274. The plasma generator may further include the high frequency power supply 273.

Hereinafter, a principle of generating plasma in the substrate processing apparatus 100 according to the embodiments and the properties of the generated plasma will be described with reference to FIG. 2.

A winding diameter, a winding pitch and the number of winding turns of the resonance coil 212 are set such that the resonance coil 212 resonates in a full-wavelength mode to form a standing wave of a predetermined wavelength. That is, the electrical length of the resonance coil 212 is set to an integral multiple of a wavelength of a predetermined frequency of the high frequency power supplied from the high frequency power supply 273.

Specifically, considering the conditions such as the power to be applied, a strength of a magnetic field to be generated and shapes of the substrate processing apparatus 100 to be applied, the resonance coil 212 having an effective cross-section of 50 $mm^2$ to 300 $mm^2$ and a diameter of 200 mm to 500 mm is wound, for example, twice to 60 times around an outer circumferential side of the process chamber 201 defining the plasma generation space 201a such that the magnetic field of about 0.01 Gauss to about 10 Gauss can be generated by the high frequency power having a frequency of 800 kHz to 50 MHz and a power of 0.5 KW to 5 KW, more preferably 1.5 KW to 3.5 KW.

The high frequency power supply 273 includes a power supply controller (not shown) and an amplifier (not shown). The power supply controller includes a high frequency oscillation circuit (not shown) and a preamplifier (not shown) in order to adjust an oscillation frequency and an output. The amplifier amplifies the output to a predetermined output level. The power supply controller controls the amplifier based on output conditions relating to the frequency and the power, which are set in advance through an operation panel (not shown), and the amplifier supplies a constant high frequency power to the resonance coil 212 via a transmission line.

In the embodiments, the frequency matching mechanism 274 detects the power of the reflected wave from the resonance coil 212 when the plasma is generated, and increases or decreases the oscillation frequency with respect to the predetermined frequency such that the power of the reflected wave is minimized. Specifically, the frequency matching mechanism 274 includes a frequency control circuit (not shown) configured to correct a preset oscillation frequency. The RF sensor 272 is provided on an output side of the amplifier of the high frequency power supply 273 in order to detect the power of the reflected wave via the transmission line and to feed back the voltage signal thereof to the frequency control circuit.

The frequency control circuit oscillates at an unloaded resonance frequency of the resonance coil 212 before the plasma is turned on, and oscillates the frequency increased or decreased from the preset frequency after the plasma is turned on so that the power of the reflected wave is minimized. As a result, the frequency control circuit supplies the frequency signal to the high frequency power supply 273 such that the reflected wave in the transmission line becomes zero.

According to the embodiments, the resonance coil 212 can more accurately form the standing wave since the high frequency power resonating accurately is output by compensating for the deviation of the resonance point in the resonance coil 212 when the plasma is generated and when the conditions for generating the plasma are changed. That is, as shown in FIG. 2, the standing wave in which the phase voltage thereof and the opposite phase voltage thereof are always canceled by each other is generated in the resonance coil 212 by the transmission of an actual resonance frequency of the resonance coil 212 reflecting the influence of the plasma, and the highest phase current is generated at the electric midpoint of the resonance coil 212 (node with zero voltage). Therefore, the induction plasma excited at the electric midpoint is hardly capacitively coupled with the walls of the process chamber 201 or the substrate support. As a result, the donut-shaped plasma with extremely low electric potential is generated in the plasma generation space 201a.

Controller

Figure 3:
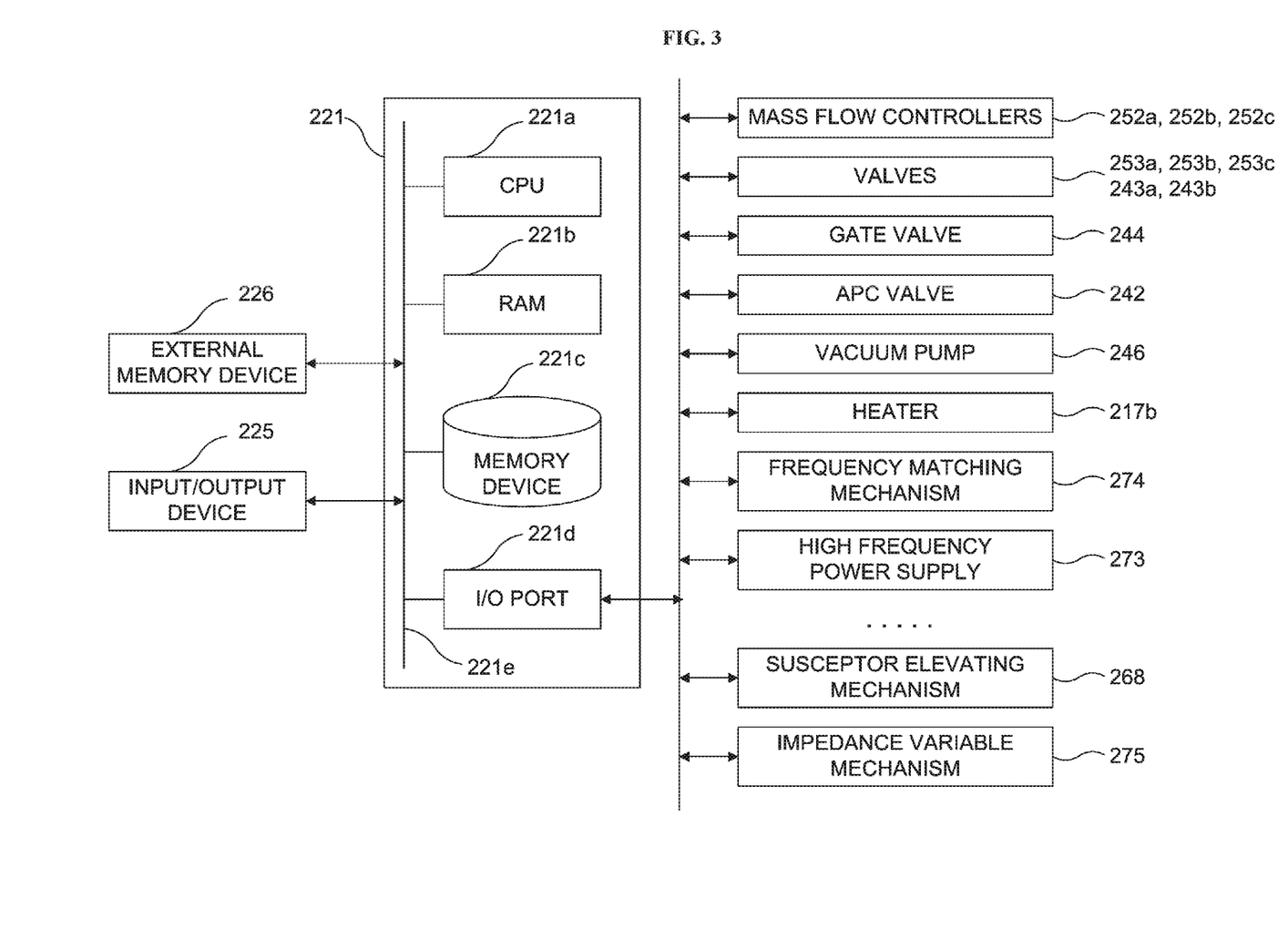
FIG. 3 is a block diagram schematically illustrating a configuration of a controller and related components of the substrate processing apparatus according to the embodiments.

As shown in FIG. 3, a controller 221 serving as a control mechanism is embodied by a computer including a CPU (Central Processing Unit) 221a, a RAM (Random Access Memory) 221b, a memory device 221c and an I/O port 221d. The RAM 221b, the memory device 221c and the I/O port 221d may exchange data with the CPU 221a through an internal bus 221e. For example, an input/output device 225 may be connected to the controller 221. In addition, a display mechanism such as a display (not shown) may be connected to the controller 221.

The memory device 221c may be embodied by components such as a flash memory, a HDD (Hard Disk Drive) and a CD-ROM. Components such as a control program configured to control the operation of the substrate processing apparatus 100 and a process recipe in which information such as the order and the condition of a substrate processing described later is stored are readably stored in the memory device 221c. The process recipe is obtained by combining steps of the substrate processing described later such that the controller 221 can execute the steps to acquire a predetermine result, and functions as a program. The RAM 221b functions as a memory area (work area) where a program or data read by the CPU 221a is temporarily stored. Hereinafter, the process recipe and the control program are collectively referred to as a "program". In the present specification, the term "program" may indicate only the process recipe, may indicate only the control program, or may indicate both of the process recipe and the control program. The RAM 221b functions as a memory area (work area) where a program or data read by the CPU 221a is temporarily stored.

The I/O port 221d is electrically connected to the above-described components such as the MFCs 252a, 252b and 252c, the valves 253a, 253b, 253c, 243a and 243b, the gate valve 244, the APC valve 242, the vacuum pump 246, the heater 217b, the RF sensor 272, the high frequency power supply 273, the frequency matching mechanism 274, the susceptor elevating mechanism 268 and the impedance variable mechanism 275.

The CPU 221a is configured to read and execute the control program stored in the memory device 221c, and to read the process recipe stored in the memory device 221c in accordance with an instruction such as an operation command inputted via the input/output device 225. The CPU 221a is configured to control the operation of the substrate processing apparatus 100 according to the process recipe. For example, as shown in FIG. 1, the CPU 221a may be configured to perform the operation, according to the process recipe, such as an operation of adjusting the opening degree of the APC valve 242, an opening/closing operation of the valve 243b, a start and stop of the vacuum pump 246, an elevating/lowering operation of the susceptor elevating mechanism 268, a power supply amount adjusting operation (temperature adjusting operation) to the heater 217b by the heater power adjustment mechanism 276 based on the temperature detected by a temperature sensor (not shown), an impedance adjusting operation by the impedance variable mechanism 275, an opening/closing operation of the gate valve 244, a controlling operation of the RF sensor 272, the frequency matching mechanism 274 and the high frequency power supply 273, gas flow rate adjusting operations of the MFCs 252a, 252b and 252c and opening/closing operations of the valves 253a, 253b, 253c and 243a.

While the embodiments will be described by way of an example in which the controller 221 is embodied by a dedicated computer system, the controller 221 is not limited to the dedicated computer system. For example, the controller 221 may be embodied by a general computer system. For example, the controller 221 may be embodied by preparing an external memory device 226 storing the above-described program and installing the program stored in the external memory device 226 into the general computer system. For example, the external memory device 226 may include a magnetic tape, a magnetic disk, an optical disk, a magneto-optical disk and a semiconductor memory. The means for providing the program to the computer is not limited to the external memory device 226. The program may be supplied to the computer using communication means such as the Internet and a dedicated line instead of the external memory device 226. The memory device 221c or the external memory device 226 may be embodied by a non-transitory computer readable recording medium. Hereafter, the memory device 221c and the external memory device 226 are collectively referred to as the recording medium. In the present specification, the term "recording medium" may refer to only the memory device 221c, only the external memory device 226 or both of the memory device 221c and the external memory device 226.

(2) Substrate Processing

Figure 4:
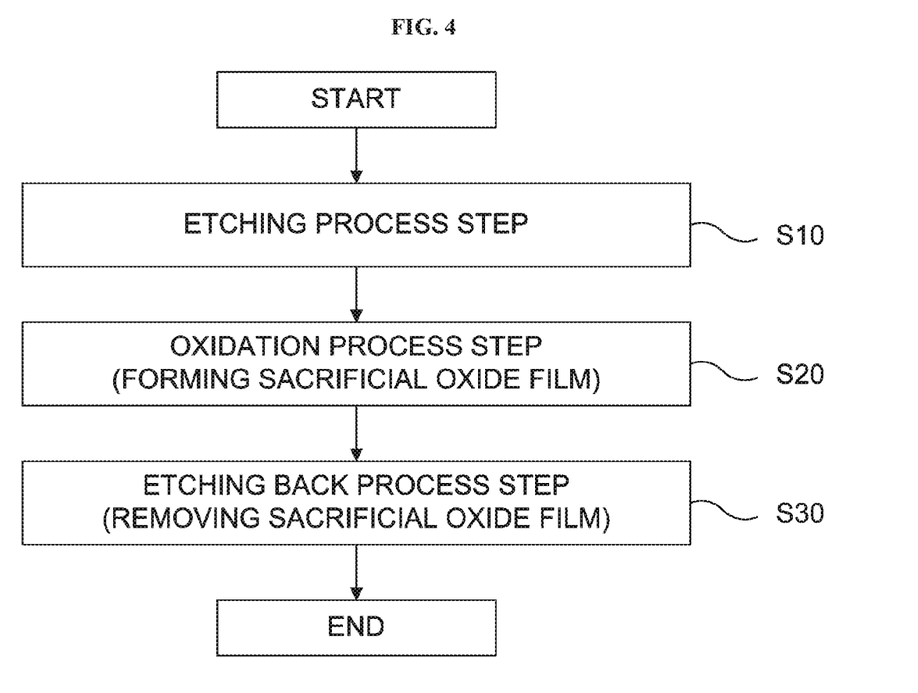
FIG. 4 is a flow chart schematically illustrating a substrate processing according to the embodiments described herein.
Figure 5:
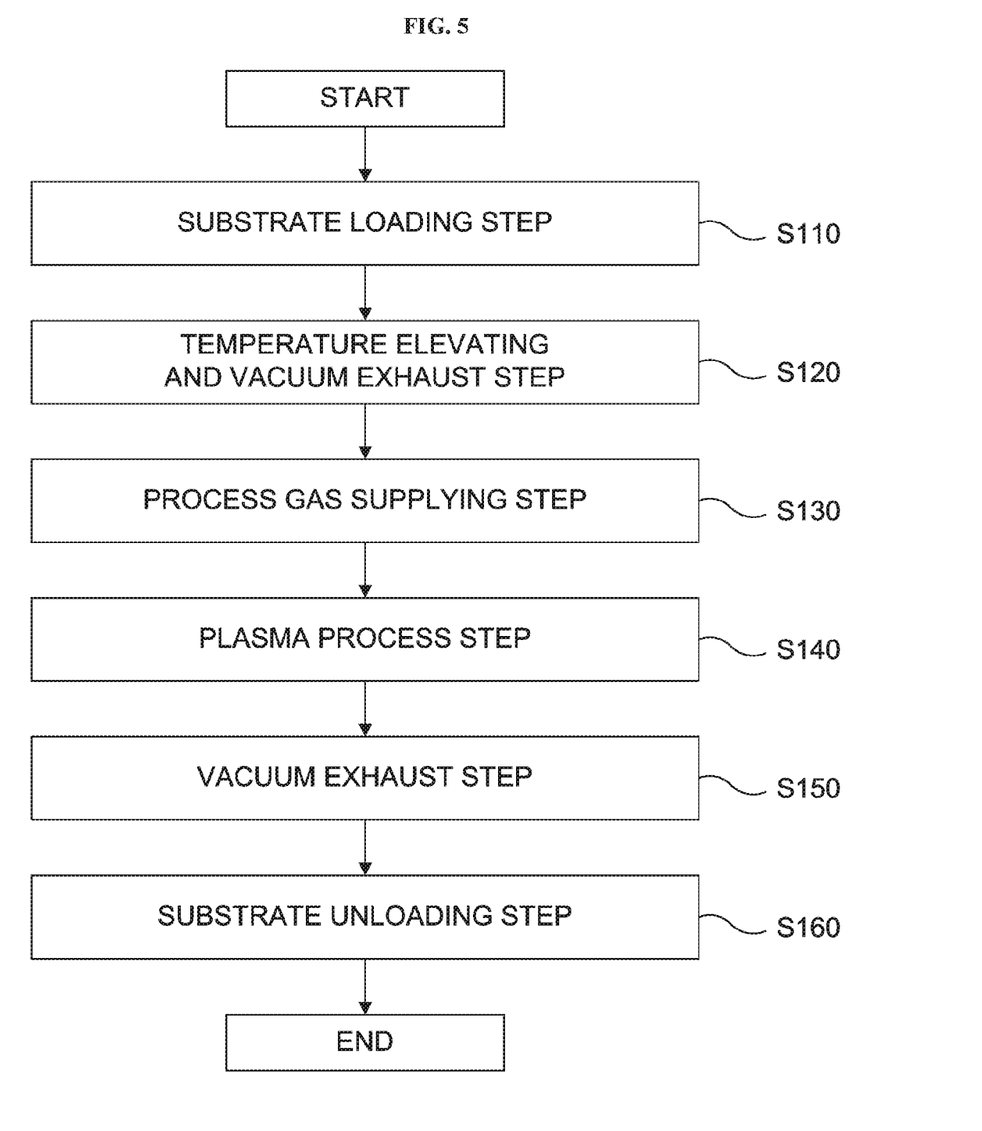
FIG. 5 is a flow chart schematically illustrating an oxidation process step of the substrate processing according to the embodiments.

Hereinafter, the substrate processing according to the embodiments will be described with reference to FIGS. 4 through 6. For example, steps S10, S20 and S30 of the substrate processing according to the embodiments shown in FIG. 4 are performed as manufacturing processes of a semiconductor device such as a flash memory. In addition, in an oxidation process step S20 according to the embodiments, a trench 301 serving as a concave structure shown in FIG. 6B is oxidized by an oxidation process to form a sacrificial oxide film 305.

(a) Etching Process Step S10

Figure 6A:
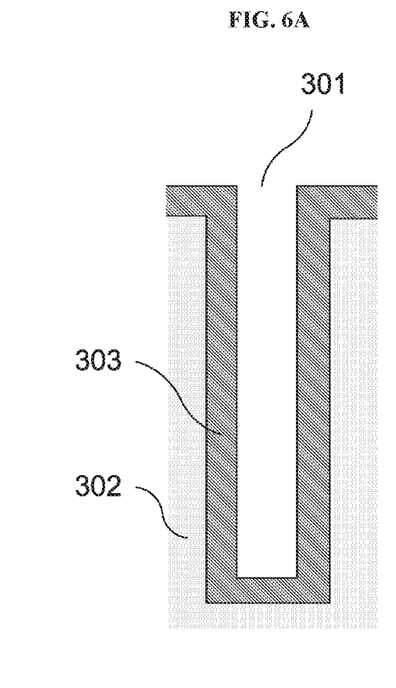
FIG. 6A schematically illustrates a pattern structure on a substrate before an etching process step of the substrate processing according to the embodiments is performed.

An etching process step S10 of etching an inner surface (inner side) of the trench 301 shown in FIG. 6A by an etching process is performed before the oxidation process step S20 according to the embodiments is performed. The trench 301 is formed by forming an amorphous silicon film (hereinafter, simply referred to as an "a-Si film") 303 serving as a silicon film on a trench formed by a silicon nitride film (hereinafter, simply referred to as a "SiN film") 302 serving as a base film (also referred to as an "underlying film"). That is, the trench 301 is formed by the a-Si film 303. In the etching process described above, anisotropic dry etching (or plasma etching) is performed to form a hole or a groove penetrating a bottom of the trench 301.

Figure 6B:
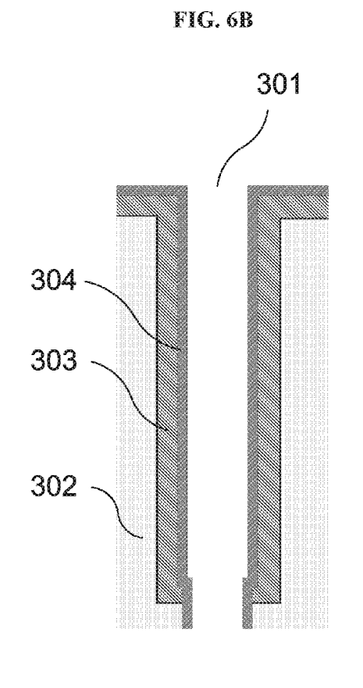
FIG. 6B schematically illustrates the pattern structure on the substrate after the etching process step of the substrate processing according to the embodiments is performed.

By performing the etching process described above, the hole or the groove penetrating the bottom of the trench 301 is formed in the bottom of the trench 301 as shown in FIG. 6B. When the hole or the trench is formed, a surface (exposed surface) of the a-Si film 303 or a surface of the SiN film 302 exposed by the etching process are damaged, and as a result, a surface of the a-Si film 303 or the surface of the SiN film 302 may be roughened. In addition, when the dry etching is performed as the etching process, ions of an etching gas collide with the surface of the a-Si film 303 to cause crystal defects, or elements contained in the etching gas are added to the a-Si film 303 or the SiN film as impurities through the surface of the a-Si film 303 or the surface of the SiN film. A surface layer (exposed layer) of the a-Si film 303 or the SiN film 302 is deteriorated by the impurities added to the a-Si film 303 or the SiN film 302 through the surface of the a-Si film 303 or the SiN film. As a result, a damaged layer 304, which is a deteriorated layer whose surface is roughened, is formed on the surface layer of the a-Si film 303 or the surface layer of the SiN film 302.

As the etching gas used for the dry etching, for example, a chlorine-based gas such as $Cl_2$ gas and $BCl_3$ gas or a fluorine-based gas such as $F_2$ gas, $CF_4$ gas and $SF_6$ gas may be used, and elements such as chlorine (Cl) and fluorine (F) is added to the damaged layer 304 as the impurities. In addition, reaction products separated from the a-Si film 303 or the SiN film 302 by the etching process may be attached to the damaged layer 304. The damaged layer 304 may further include the attached reaction products.

Figure 6C:
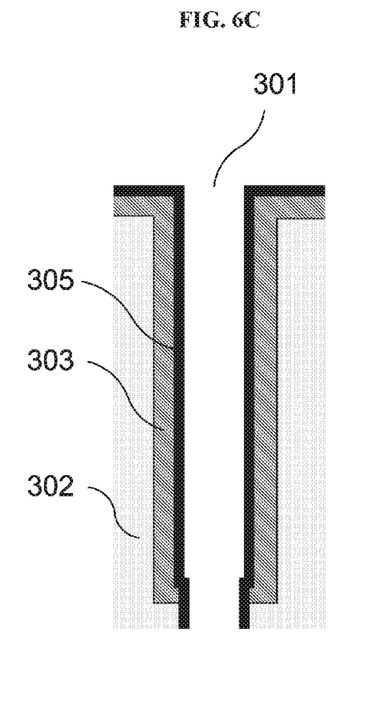
FIG. 6C schematically illustrates the pattern structure on the substrate after the oxidation process step of the substrate processing according to the embodiments is performed.
Figure 6D:
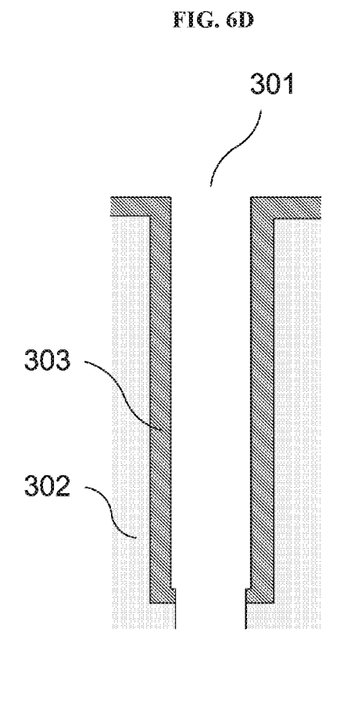
FIG. 6D schematically illustrates the pattern structure on the substrate after an etching back process step of the substrate processing according to the embodiments is performed.

Since the surface of the damaged layer 304 formed on the surface of the a-Si film 303 is roughened, it may deteriorate the electrical characteristics (for example, the electron mobility) of the a-Si film 303 constituting the semiconductor device. Therefore, it is preferable to remove the damaged layer 304. In the oxidation process step S20 according to the embodiments, the trench 301 where the damaged layer 304 is formed is oxidized by the oxidation process to form the sacrificial oxide film 305, and then the sacrificial oxide film 305 is removed (also referred to as "etched back") to remove the damaged layer 304. As a result, it is possible to obtain the a-Si film 303 and the SiN film 302 with flat surfaces from which the damaged layer 304 has been removed.

(b) Oxidation Process Step S20 (Forming Sacrificial Oxide Film)

The oxidation process step S20 according to the embodiments is performed by the substrate processing apparatus 100 described above. In the following description, the operations of the components of the substrate processing apparatus 100 are controlled by the controller 221. The trench 301 formed on a surface of the wafer 200 processed in the oxidation process step S20 according to the embodiments is of a shape with a high aspect ratio. In the present specification, "a shape with a high aspect ratio" refers to, for example, a shape with an aspect ratio (D/H) equal to or greater than 20 where "D" indicates a depth of the trench 301 and "H" indicates a width of the trench 301. In addition, in the surface of the damaged layer 305 exposed to the inner surface of the trench 301, the crystal orientation may vary depending on the position. For example, in a surface extending in a depth direction of the trench 301 (that is, the vertical direction) shown in FIG. 6B and in a surface extending in a width direction of the trench 301 (that is, the horizontal direction) at the bottom of trench 301 (that is, the position of the bottom of trench 301 before the etching process is performed), the crystal orientation may be different between each other.

In the oxidation process step S20, in order to remove the damaged layer 304, the inner surface of the trench 301 (including the exposed surface of the SiN film 302 exposed by the etching process) is oxidized by the oxidation process to at least a thickness of the damaged layer 304. That is, a thickness of the sacrificial oxide film 305 is at least greater (thicker) than the thickness of the damaged layer 304. A high level of thickness uniformity (step coverage) is required for the a-Si film 303 left in the trench 301 after removing the sacrifice oxide film 305. For example, when the a-Si film 303 is used as a channel layer of a transistor, it is preferable that the a-Si film 303 is thin and uniform.

In particular, since a crystallinity of the a-Si film 303 is changed in a temperature range of 600° C. or more, desired film characteristics cannot be obtained in the temperature range of 600° C. or more. Therefore, it is preferable that a process temperature of forming the sacrificial oxide film 305 is equal to or less than 600° C., preferably, equal to or less than 550° C.

In general, a rate of wet etching (wet etching rate: WER) of an oxide film increases as the oxide film is formed under lower temperature conditions. Therefore, in consideration of removing the sacrificial oxide film 305 by a method such as the wet etching after the oxidation process step S20, it is more preferable that the process temperature of forming the sacrificial oxide film 305 is as low as possible within an allowable range.

As a method of forming the sacrificial oxide film, for example, a thermal oxidation method (also referred to as a "thermal radical oxidation method") may be used. According to the thermal oxidation method, a wafer is heated to 700° C. to 1,100° C. and an oxidation process is performed on the wafer heated to 700° C. to 1100° C. using oxygen gas or water vapor gas. However, particularly when the thermal oxidation method is applied to the trench 301 with the high aspect ratio as in the embodiments, it is difficult to obtain a desired thickness uniformity (step coverage) of the sacrificial oxide film 305 in the trench 301 due to a microloading effect on the thickness of the sacrificial oxide film 305 in the depth direction of the trench 301 or a dependency of underlying layer conditions such as a plane orientation dependency. In addition, when the thermal oxidation method is applied, it is required to heat the wafer to 700° C. or more. As a result, the process temperature condition described above cannot be satisfied when the thermal oxidation method is applied. Therefore, in the oxidation process step S20 according to the embodiments, the sacrificial oxide film 305 is formed by performing the following steps S110, S120, S130, S140, S150 and S160 to satisfy the process temperature condition described above.

Substrate Loading Step S110

First, the wafer 200 is transferred (loaded) into the process chamber 201. Specifically, the susceptor 217 is lowered to a position for transferring the wafer 200 (also referred to as a "wafer transfer position") by the susceptor elevating mechanism 268. The wafer lift pins 266 penetrate the through-holes 217a of the susceptor 217. As a result, the wafer lift pins 266 protrude from the surface of the susceptor 217. Next, the gate valve 244 is opened and the wafer 200 is loaded into the process chamber 201 by a transfer mechanism (not shown). As a result, the wafer 200 is placed on the wafer lift pins 266. Thereafter, the susceptor elevating mechanism 268 elevates the susceptor 217 until the susceptor 217 is at a predetermined position between the lower end 203a of the resonance coil 212 and an upper end 245a of the substrate loading/unloading port 245. As a result, the wafer 200 is placed on an upper surface of the susceptor 217 and supported by the susceptor 217.

Temperature Elevating and Vacuum Exhaust Step S120

Next, a temperature of the wafer 200 is elevated. The heater 217b embedded in the susceptor 217 is heated in advance. By placing the wafer 200 loaded into the process chamber 201 on the susceptor 217 where the heater 217b is embedded, the wafer 200 is heated to a predetermined temperature. For example, the predetermined temperature of the wafer 200 may range from the room temperature to 600° C., preferably from 100° C. to 600° C., more preferably from 200° C. to 550° C. In particular, in order to suppress the change in the crystallinity of the a-Si film 303, it is preferable that the predetermined temperature of the wafer 200 is equal to or less than 550° C. In general, the lower the process temperature in the oxidation process, the lower the quality of the oxide film formed by the oxidation process. Since the oxide film formed in the oxidation process step S20 is used as the sacrificial oxide film 305, the quality of the oxide film is not so much required as other cases where the oxide film is used otherwise. Therefore, in the oxidation process step S20 in the embodiments, the oxidation process may be performed under the low temperature conditions.

While the wafer 200 is being heated, the vacuum pump 246 vacuum-exhausts the inside of the process chamber 201 through the gas exhaust pipe 231 such that an inner pressure of the process chamber 201 is at a predetermined pressure. The vacuum pump 246 vacuum-exhausts the inside of the process chamber 201 at least until the substrate unloading step S160 described later is completed.

Process Gas Supplying Step S130

Next, a mixed gas of the oxygen ($O_2$) gas serving as the oxygen-containing gas and the hydrogen ($H_2$) gas serving as the hydrogen-containing gas is supplied into the process chamber 201. The mixed gas serves as the process gas (reactive gas). Specifically, the valves 243a and 253a are opened to supply the $O_2$ gas into the process chamber 201 via the buffer chamber 237 while the flow rate of the $O_2$ gas is adjusted by the MFC 252a. Simultaneously, the valve 253b is opened to supply the $H_2$ gas into the process chamber 201 via the buffer chamber 237 while the flow rate of the $H_2$ gas is adjusted by the MFC 252b. In addition, the argon (Ar) gas serving as an additive gas may be supplied from the argon gas supply source 250c to the buffer chamber 237 via the gas supply pipe 232c provided with the MFC 252c and the valve 253c, if necessary.

In the process gas supplying step S130, for example, a total flow rate of the mixed gas of the $O_2$ gas and the $H_2$ gas is set to a predetermined flow rate ranging from 100 sccm to 3,000 sccm, and a ratio of the flow rate of the $O_2$ gas to the flow rate of the $H_2$ gas supplied to the process chamber 201 is set to a predetermined ratio ranging from 5:95 to 99:1. In particular, by setting the ratio of the flow rate of the $O_2$ gas to the flow rate of the $H_2$ gas to a ratio about 95:5, it is possible to maximize an oxidation rate of the oxidation process. In addition, by setting the ratio of the flow rate of the $O_2$ gas to the flow rate of the $H_2$ gas to a ratio ranging from 5:95 to 50:50, even when a film such as a metal film is formed on the wafer 200, it is possible to perform the oxidation process selectively on the surface of the trench 301 serving as an oxidation target by suppressing the oxidation of the film such as the metal film. In the embodiments, for example, the total flow rate of the mixed gas is set to 1,000 sccm, and the ratio of the flow rate of the $O_2$ gas to the flow rate of the $H_2$ gas is set to 95:5.

While the embodiments are described by way of an example in which the mixed gas of the oxygen-containing gas and the hydrogen-containing gas is used as the process gas, only an oxygen-containing gas without containing the hydrogen (H) atom (for example, the $O_2$ gas) may be used as the process gas. However, as the process gas, it is preferable to use the hydrogen-containing gas with the oxygen-containing gas from a viewpoint of improving characteristics such as the oxidation rate. In addition, in the oxidation process step S20, it is preferable that no impurities remain in the film after the oxidation process. Therefore, it is preferable that the mixed gas of the $O_2$ gas and the $H_2$ gas containing only oxygen (O) atoms and hydrogen (H) atoms is used as the process gas.

The inside of the process chamber 201 is exhausted by adjusting the opening degree of the APC valve 242 such that the inner pressure of the process chamber 201 is at a predetermined pressure ranging from 10 Pa to 250 Pa, preferably from 100 Pa to 250 Pa. For example, in the embodiments, the predetermined pressure is 150 Pa. As described above, while exhausting the inside of the process chamber 201 appropriately, the mixed gas is continuously supplied until the plasma process step S140 described later is completed. In addition, the $H_2$ gas may be introduced (supplied) into the process chamber 201 before supplying the mixed gas to adjust the inner pressure of the process chamber 201 to a predetermined pressure. By supplying the $H_2$ gas before supplying the mixed gas, it is possible to suppress the occurrence of rapid oxidation at the start of the supply of the mixed gas.

Plasma Process Step S140

After a predetermined time elapses from the start of the supply of the mixed gas (for example, after several seconds elapse) and the inner pressure of the process chamber 201 is stabilized, the high frequency power is applied to the resonance coil 212 from the high frequency power supply 273 via the RF sensor 272. In the embodiments, for example, the frequency and the power of the high frequency power are set to 27.12 MHz and 2.5 kW, respectively.

In the plasma process step S140, the resonance coil 212 more accurately form the standing wave since the power supply controller included in the high frequency power supply 273 compensates for the deviation of the resonance point in the resonance coil 212 generated by the fluctuation of the capacitive coupling and the inductive coupling of the plasma to maintain the resonance state.

As a result, the donut-shaped induction plasma with extremely low electric potential, which is hardly capacitively coupled with the walls of the process chamber 201 or the substrate support, is excited at a height corresponding to the electric midpoint of the resonance coil 212 in the plasma generation space 201a. The $O_2$ gas and the $H_2$ gas are activated by the excited plasma and dissociate. As a result, reactive species such as oxygen active species (radicals) containing oxygen (O) elements and hydrogen (H) elements, oxygen ions, hydroxyl active species (radicals), hydrogen active species (radicals) and hydrogen ions are generated. When a rare gas (Ar gas) is added, the rare gas contributes to the stabilization of the plasma discharge. The reactive species containing the oxygen elements is supplied to the exposed surface in the trench 301, and the surface layer is oxidized to form the sacrificial oxide film 305 by the reactive species.

According to the embodiments, since the plasma with extremely low electric potential is generated, it is possible to prevent a plasma sheath from being generated on the wall of the plasma generation space 201 or on the substrate support. Therefore, the ions in the plasma are not accelerated, and the active species in the mixed gas and the ions in the non-accelerated state are uniformly supplied into the trench 301 (particularly, in the depth direction). As a result, it is possible to form the oxide film (sacrificial oxide film 305) with excellent thickness uniformity in the depth direction of the trench 301.

In addition, the surfaces with different crystal orientations are exposed in the trench 301. In the plasma process step S140, when the oxidation process is performed on the surface layer of the trench 301 using the reactive species generated by the plasma generator according to the embodiments, the activation energy of the oxidation reaction according to the embodiments is lower than the activation energy of the oxidation reaction generated by other plasma excitation method (for example, a method such as a microwave excitation method) or generated by the thermal excitation. Therefore, it is possible to apply the oxidation process with the same oxidation rate even on the surfaces with different crystal orientations and with different binding energies. That is, since the oxidation process with small crystal orientation dependency can be performed, the embodiments are particularly preferable when the inside of the trench 301 is oxidized with good thickness uniformity.

After a predetermined process time elapses from the start of the application of the high frequency power, for example, after 10 seconds to 300 seconds elapse, the output of the power from the high frequency power supply 273 is stopped to stop the plasma discharge in the process chamber 201. The valves 253*a* and 253*b* are closed to stop the supply of the mixed gas into the process chamber 201. Thereby, the plasma process step S140 is completed. It is preferable that the oxidation process of the plasma process step S140 is continuously performed at least the thickness of the sacrificial oxide film 305 is equal to or greater than the thickness of the damaged layer 304 and the entirety of the damaged layer 304 is changed (modified) to the sacrificial oxide film 305.

Vacuum Exhaust Step S150

After the predetermined process time elapses and the supply of the mixed is stopped, the inside of the process chamber 201 is vacuum-exhausted by using the gas exhaust pipe 231. As a result, residues in the process chamber 201 such as the mixed gas and an exhaust gas generated by the reaction of the mixed gas are exhausted to the outside of the process chamber 201. Thereafter, the opening degree of the APC valve 242 is adjusted such that the inner pressure of the process chamber 201 is adjusted to the same pressure as that of a vacuum transfer chamber (not shown) provided adjacent to the process chamber 201 where the wafer 200 is transferred in the substrate unloading step S160 described below.

Substrate Unloading Step S150

After the inner pressure of the process chamber 201 reaches a predetermined pressure, the susceptor 217 is lowered to the wafer transfer position described above until the wafer 200 is supported by the wafer lift pins 266. Then, the gate valve 244 is opened and the wafer 200 is unloaded from the process chamber 201 to the outside of the process chamber 201 by using the transfer mechanism (not shown). Thereby, the oxidation process step S20 according to the embodiments is completed.

(c) Etching Back Process Step S30 (Removing Sacrifice Oxide Film)

Subsequently, in the etching back process step S30 of the embodiments, the sacrificial oxide film 305 is removed (etched back) by an etching back process mainly by performing the wet etching. In the wet etching, for example, an aqueous solution such as an aqueous solution of HF (hydrofluoric acid) and an aqueous solution of NH$_4$F (ammonium fluoride) may be used as a chemical solution, and the wafer 200 is immersed in the chemical solution. The sacrificial oxide film 305 which is a silicon oxide film is selectively removed by the etching using the chemical solution, and the trench 301 constituted by the a-Si film 303 with the damaged layer 304 removed and the SiN film 302 is formed as shown in FIG. 5D.

According to the embodiments, the sacrificial oxide film 305 with good thickness uniformity is formed on the inner surface of the trench 301. Therefore, even after the etching process step S10 and the etching back process step S30 is performed, it is possible to obtain the desired electrical characteristics without unwanted variation (non-uniformity) in the thickness of the a-Si film 303.

While the embodiments are described by way of an example in which the a-Si film is formed in the trench, the embodiments are not limited thereto. For example, instead of the a-Si film, the oxidation process step according to the embodiments may also be applied to oxidize another silicon film such as a polysilicon film (Poly-Si film) and a crystalline silicon film (c-Si film) formed in the trench.

While the embodiments are described by way of an example in which the trench structure is exemplified as the concave structure formed on the wafer 200. However, the substrate processing according to the embodiments may also be applied to process a concave structure such as a hole or a through-hole with the same high aspect ratio.

In addition, as long as the damaged layer is formed in the trench 301 in the etching process step S10, an etching method other than the method described in the embodiments may also be applied. Similarly, in the etching back processing step S30, an etching method other than the method described in the embodiments may also be applied.

According to some embodiments in the present disclosure, it is possible to form the sacrificial oxide film with good thickness uniformity on the inner surface of the concave structure formed on the surface of the substrate in the manufacturing process of the semiconductor device.

What is claimed is:

1. A method of manufacturing a semiconductor device comprising:
    (a) providing a semiconductor processing apparatus comprising:
        a substrate process chamber comprising a plasma generation space where an oxygen-containing gas supplied thereto is plasma-excited and a substrate processing space in communication with the plasma generation space and capable of accommodating a substrate therein during a substrate processing;
        a coil provided at an outer peripheral portion of the plasma generation space wherein an electrical length of the coil is set to an integral multiple of a wavelength of a high frequency power applied thereto; and
        a substrate support capable of supporting the substrate below a lower end of the coil;
    (b) placing a target substrate with a concave structure of a silicon film formed thereon on the substrate support, wherein a deteriorated layer is formed on an inner surface of the concave structure by deterioration of a surface layer of the silicon film due to an etching process on the concave structure, and the deteriorated layer comprises a plurality of exposed surfaces with crystal orientations different between one another;
    (c) supplying the oxygen-containing gas into the substrate process chamber;
    (d) applying the high frequency power to the coil to generate plasma of the oxygen- containing gas in the plasma generation space; and
    (e) oxidizing, by the plasma, a surface of the silicon film exposed in the concave structure wherein the deteriorated layer is formed on the surface.

2. The method of claim 1, further comprising:
    (f) removing a silicon oxide film formed by oxidizing the surface layer of the silicon film in (e).

3. The method of claim 1, wherein an entirety of the deteriorated layer is oxidized to form a silicon oxide film in (e).

4. The method of claim 3, wherein the surface of the silicon film is oxidized in (e) such that a thickness of the silicon oxide film formed by oxidizing the surface layer of the silicon film is uniform in the concave structure.

5. The method of claim 1, wherein the silicon film comprises an amorphous silicon film.

6. The method of claim 5, wherein a temperature of the target substrate is equal to or less than 550° C. in (e).

7. The method of claim 1, wherein an aspect ratio of the concave structure is equal to or greater than 20.

8. A method of manufacturing a semiconductor device comprising:
- (a) performing an etching process on an inner surface of a concave structure of a silicon film formed on a substrate;
- (b) providing a semiconductor processing apparatus comprising:
  - a substrate process chamber comprising a plasma generation space where an oxygen-containing gas supplied thereto is plasma-excited and a substrate processing space in communication with the plasma generation space and capable of accommodating the substrate therein during a substrate processing;
  - a coil provided at an outer peripheral portion of the plasma generation space wherein an electrical length of the coil is set to an integral multiple of a wavelength of a high frequency power applied thereto; and
  - a substrate support capable of supporting the substrate below a lower end of the coil;
- (c) placing the substrate after the etching process is performed, wherein a deteriorated layer is formed on the inner surface of the concave structure by deterioration of a surface layer of the silicon film when the etching process is performed on the inner surface of the concave structure, and the deteriorated layer comprises a plurality of exposed surfaces with crystal orientations different between one another;
- (d) supplying the oxygen-containing gas into the substrate process chamber;
- (e) applying the high frequency power to the coil to generate plasma of the oxygen- containing gas in the plasma generation space;
- (f) oxidizing, by the plasma, a surface of the silicon film exposed in the concave structure wherein the deteriorated layer is formed on the surface; and
- (g) removing a silicon oxide film formed by oxidizing the surface of the silicon film in (f).

* * * * *